United States Patent

[11] 3,617,980

[72] Inventors John C. Alkire
Santa Ana;
Donn G. Nelson, Orange, both of Calif.
[21] Appl. No. 47,498
[22] Filed June 18, 1970
[45] Patented Nov. 2, 1971
[73] Assignee Anaconda Wire and Cable Company

[54] PRINTED CIRCUIT BOARD CONNECTOR CLIP
8 Claims, 3 Drawing Figs.

[52] U.S. Cl. 339/32 R, 24/73 MF, 174/52 R, 317/101 DH, 339/17 R, 339/176 MP, 339/258 R
[51] Int. Cl. H01r 27/02
[50] Field of Search 339/17, 32, 75, 176, 217, 256, 258, 278, 119, 125; 248/361 TF; 24/73 B, 73 C, 73 BC, 73 SC, 73 PP, 255 R, 73 MF; 174/52; 317/101 C, 101 D, 101 DH

[56] References Cited

UNITED STATES PATENTS

| | | | |
|---|---|---|---|
| 3,221,293 | 11/1965 | Regan | 24/255 X |
| 3,221,216 | 11/1965 | Kobryner | 339/318 X |
| 3,205,546 | 9/1965 | Nelson | 24/73 MF X |
| 3,076,953 | 2/1965 | Sloop | 339/278 R X |
| 3,059,153 | 10/1962 | Shaffer | 339/17 C X |

*Primary Examiner*—Stephen J. Novosad
*Assistant Examiner*—Terrell P. Lewis
*Attorney*—Victor F. Volk

ABSTRACT: A clip is described that can be folded from a single sheet metal stamping and which, when fastened to a printed circuit board, will accept and grip connector pins from above, below, or across the board.

INVENTORS
JOHN C. ALKIRE
DONN G. NELSON
BY V. T. Voek
THEIR AGENT

PRINTED CIRCUIT BOARD CONNECTOR CLIP

BACKGROUND OF THE INVENTION

As printed circuit boards have become more miniaturized and, particularly, as applications have been devised where the boards are replaceable and interchangeable, known means for making connection to the boards from outside circuits or power sources have not been adequately reliable and, at the same time, convenient. This problem has been aggravated by the need to introduce connector pins sometimes from the top, sometimes from the top, sometimes from the bottom, and sometimes from the side according to the assembly of the circuit boards.

SUMMARY

We have invented a clip by means of which we propose to be able to connect contact pins from either above, below, or beside a printed circuit board.

We further propose our clip to be adaptable to a range of pin diameters.

We further propose a clip that will accept connector pins at angles other than angles normal or parallel to the board.

We further propose a clip that can be used for thermal as well as electrical connections.

We further propose a clip that can be mounted away from as well as at the edge of a printed circuit board.

We further propose a clip that can serve to guide a printed circuit board within a chassis.

We further propose a clip that will afford shock and vibration resistance.

We further propose a clip that can be folded from a single sheet metal stamping.

To achieve these proposals we have invented a circuit board connector clip comprising first and second metallic strips comprising flat portions mountable against the board. The second strip, which may advantageously be integrally connected to the first strip by a coplanar connecting strip, is parallel to and at a selected distance from the first strip, providing a spacing between them. Our invention also comprises extensions of the strips folded to taper toward each other from the flat portions and continuations of the extensions folded back toward the flat portions and through the spacing. These continuations provide parallel, planar surfaces for gripping connector pins. Our clip also comprises projections of the continuations that flare apart from the spacing, and tabs extending from the continuations substantially normal to the flat portions. These tabs also flare apart and comprise a guide into the space between the gripping surfaces.

Advantageously, our clip also comprises alignment tabs cut from the extensions and folded from the flat portions away from the extensions, for fastening the clip to a printed circuit board or other surface.

DETAILED DESCRIPTION OF PREFERRED EMBODIMENTS

Figure 2:
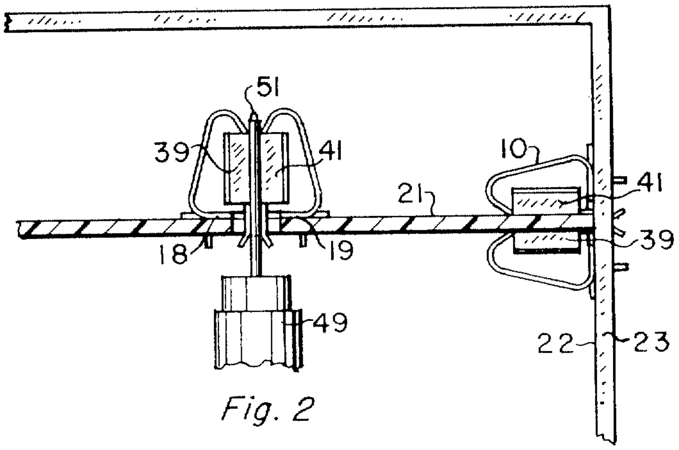
FIG. 2 shows a section of a printed circuit board guided into a chassis by means of our invention and mounting a clip of our invention.
Figure 1:
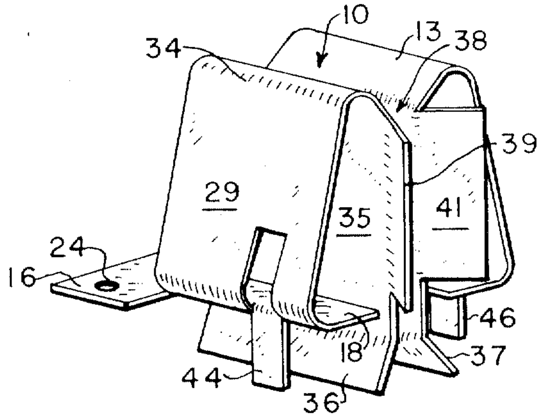
FIG. 1 shows a pictorial view of the clip of our invention.
Figure 3:
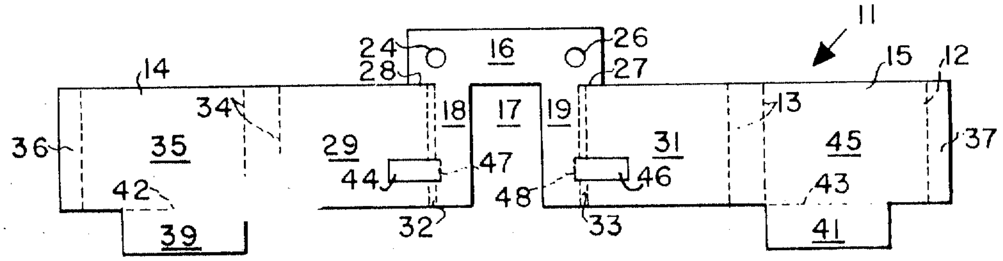
FIG. 3 shows a sheet metal stamping used to fabricate a clip of our invention.

The clip indicated generally by the numeral 10 of FIG. 1 is manufactured by folding the stamping 11 of FIG. 3 along the indicated dashed fold lines, such as lines 12,13. The stamping 11 has two strips 14,15 interconnected by an integral strip 16 so as to leave a spacing 17 between the strips 14,15. When the stamping 11 is folded, two flat portions 18,19 coplanar with the strip 16 provide a surface for mounting on a printed circuit board 21 (FIG. 2) or other surface such as surface 22 of a chassis 23. Holes 24,26 in the strip 16 provide means permanently to fasten the clip to a surface during assembly. Short slits 27,28 between the strip 16 and the strips 14,15 permit extensions 29,31 from the flat portions 18,19 to be folded together upwardly at lines 32,33. Continuations 35,45 of the extensions 29,31 are again folded along lines 34,13 so that they extend back down through the spacing 17 and terminate in projections 36,37 that flare outwardly below the spacing 17 to form a guide into a space 38 between the facing surfaces of the continuations 35,45. Tabs 39,41 extending from the continuations 35,45 are folded along lines 42,43 to flare outwardly and serve as additional guides into the space 38. For fastening our clip 10 in a precise location on a printed circuit board, two alignment tabs 44,46 are cut from the extensions 29,31 to fold from the flat portions 18,19 at lines 47,48. All the folds made in the strips of our clip are rounded so that smooth surfaces are provided for guiding pins into the gripping area or space 38, and it should be noted, as can be visualized form FIG. 1, that a pin does not have to enter the clip at any precise angle to be received into the gripping space.

To mount the clip 10 on a board 21 the edge of the board should be cut out corresponding to the spacing 17, two slots punched to receive the tabs 44,46, and holes punched for permanent eyelets or rivets through the holes 24,26. The tabs 44,46, when the clip has been precisely adjusted, are soldered to the copper lamination of the printed circuit board. In FIG. 2 a coaxial cable termination 49 with a connecting pin 51 has been connected to the clip through the bottom and the board 21 has itself been guided into the chassis 23 through the guide tabs 39,41 of a clip 10 mounted on the chassis. The broad contacting surfaces defining the space 38 and flat portions 16,18,19 provide means for excellent heat transfer and the clip will act either as a heat sink or means to transfer heat from a printed circuit board to an outside chassis.

In the use of our clip the pin 51 might be inserted downwardly into the clip through the rounded surfaces at the lines 13 and 34 or through the tabs 39 and 41. Where, however, the connector is fixed to the chassis, the printed circuit boards, with clips attached, can be easily removed or deposited in the chassis and it is not required that the pins 51 be inserted point first into the chassis. If, for example, the termination 49 were fixed upright in the position shown in FIG. 2, the board 21 might have been moved into engagement with it by pushing the tabs 39–41 horizontally against the pin.

We prefer to use a springy bronze sheet such as a beryllium bronze, heat treated in a known manner after folding, for the clip 10 and to apply a light gold plate to the clip surfaces, but other materials may also be used within the scope of our invention.

We have invented a new and useful article of which the foregoing description has been exemplary rather than definitive and for which we desire an award of Letters Patent as defined in the following claims.

We claim:

1. A printed circuit board connector clip comprising:
   A. a first metallic strip comprising a flat portion mountable against said board,
   B. a second metallic strip comprising a flat portion mountable against said board parallel to and at a selected distance from said first strip and providing a spacing therebetween,
   C. extensions of said strips folded to taper toward each other from said flat portions,
   D. continuations of said extensions folded back toward said flat portions and through said spacing, said continuations comprising parallel, pin gripping, planar surfaces,
   E. projections of said continuations flaring apart from said spacing, and
   F. tabs extending from said continuations substantially normal to said flat portions, said tabs flaring apart to comprise a guide into the space between said gripping surfaces.

2. The clip of claim 1 comprising curved surfaces between said extensions and said continuations comprising a guide into the space between said gripping surfaces.

3. The clip of claim 1 comprising a strip connecting said flat portions and integral therewith.

4. The clip of claim 2 comprising a strip connecting said flat portions and integral therewith.

5. The clip of claim 3 wherein said connecting strip is substantially coplanar to said portions for mounting flat against a support.

6. The clip of claim 4 wherein said connecting strip is substantially coplanar to said portions for mounting flat against a support.

7. The clip of claim 1 comprising alignment tabs cut from said extensions and folded from said flat portions away from said extensions for fastening said clip to said board.

8. The clip of claim 6 comprising alignment tabs cut from said extensions and folded from said flat portions away from said extensions for fastening said clip to said board.

* * * * *